United States Patent
Ting et al.

(10) Patent No.: US 11,650,664 B2
(45) Date of Patent: *May 16, 2023

(54) PIEZOELECTRIC VIBRATION MODULE AND HAPTIC FEEDBACK MODULE

(71) Applicant: CHUNG-YUAN CHRISTIAN UNIVERSITY, Chung Li (TW)

(72) Inventors: Yung Ting, Chung Li (TW); Sheuan-Perng Lin, Chung Li (TW); Jun-Hong Lin, Chung Li (TW); Zih-Jie Lin, Chung Li (TW)

(73) Assignee: CHUNG-YUAN CHRISTIAN UNIVERSITY, Chung Li (TW)

( * ) Notice: Subject to any disclaimer, the term of this patent is extended or adjusted under 35 U.S.C. 154(b) by 187 days.

This patent is subject to a terminal disclaimer.

(21) Appl. No.: 16/952,894

(22) Filed: Nov. 19, 2020

(65) Prior Publication Data

US 2021/0373666 A1    Dec. 2, 2021

(30) Foreign Application Priority Data

May 29, 2020 (TW) ................................ 109118041

(51) Int. Cl.
*G06F 3/041* (2006.01)
*G06F 3/01* (2006.01)

(52) U.S. Cl.
CPC .......... *G06F 3/016* (2013.01); *H10N 30/2023* (2023.02); *G06F 3/041* (2013.01)

(58) Field of Classification Search
CPC ........ G06F 3/016; G06F 3/041; G06F 3/0202; G06F 2203/04103; G06F 3/03547; G06F 3/0416; G06F 3/0414; H01L 41/0913; H01L 41/0933; B06B 1/0629
See application file for complete search history.

(56) References Cited

U.S. PATENT DOCUMENTS

| | | | |
|---|---|---|---|
| 2008/0084384 A1* | 4/2008 | Gregorio | G06F 3/016 345/156 |
| 2010/0090813 A1* | 4/2010 | Je | G06F 3/0202 340/407.2 |
| 2012/0039057 A1* | 2/2012 | Paleczny | G06F 3/041 200/333 |
| 2013/0004922 A1* | 1/2013 | Takahashi | G09B 21/004 434/113 |

FOREIGN PATENT DOCUMENTS

TW    201828001 A    8/2018

* cited by examiner

*Primary Examiner* — Temesghen Ghebretinsae
*Assistant Examiner* — Sosina Abebe
(74) *Attorney, Agent, or Firm* — Muncy, Geissler, Olds & Lowe, P.C.

(57) ABSTRACT

A piezoelectric vibration module has a first soft circuit board and a plurality of piezoelectric units. The first soft circuit board includes a plurality of cutting areas. Two adjacent cutting areas are spaced with a cut through groove. Each piezoelectric unit is respectively configured below each cutting area.

16 Claims, 13 Drawing Sheets

PIEZOELECTRIC VIBRATION MODULE AND HAPTIC FEEDBACK MODULE

BACKGROUND OF INVENTION

1. Field of the Invention

The present invention relates generally to a piezoelectric vibration module and haptic feedback module, and more particularly to a piezoelectric vibration module and haptic feedback module including a soft circuit board with a rectangular or arcuate cut through groove to reduce interference between each of the piezoelectric units and to maintain operational independence between the components of the piezoelectric vibration module and haptic feedback module.

2. Description of Related Art

Through an appropriate arrangement, vibration components made of rectangular or round piezoelectric materials can be formed into an array vibration device to realize the functions of driving and/or sensing when combined with a soft circuit board. However, if the whole surface of the soft circuit board is bonded with vibration components, the operation of one or more of the vibration components may be subject to interference from non-corresponding areas of the soft circuit board and their performance may be affected. Therefore, an improvement based on the size of each vibration component wherein the soft circuit board is cut to have hollowed-out areas matching each of the vibration components such that they can operate independently without interference is necessary. In addition, when the vibration components mentioned above are used on touch panels and the whole surface of the soft circuit board is bonded with piezoelectric components, the operation of one or more of the piezoelectric components may drive other areas of the soft circuit board to vibrate, causing interference that can affect the feedback effect. Therefore, an improvement is required.

SUMMARY OF THE INVENTION

The object of the present invention is to provide a piezoelectric vibration module of a soft circuit board with rectangular or arcuate cut through grooves to reduce interference between each of the piezoelectric units and to maintain the operational independence of each of the components of the piezoelectric vibration module.

The object of the present invention is to provide a haptic feedback module of a soft circuit board with rectangular or arcuate cut through grooves to reduce interference between each of the piezoelectric units and to maintain the operational independence of each of the components of the haptic feedback module.

To accomplish the above object, the present invention provides a piezoelectric vibration module, which comprises a first soft circuit board and a plurality of piezoelectric units. The first soft circuit board comprises a plurality of cutting areas, and two adjacent cutting areas are spaced with a cut through groove. Each piezoelectric unit is respectively configured below each cutting area.

The present invention further provides a haptic feedback module comprising a touch panel and a piezoelectric vibration module, the piezoelectric vibration module comprising a first soft circuit board and a plurality of piezoelectric units. The first soft circuit board comprises a plurality of cutting areas and two adjacent cutting areas spaced with a cut through groove. Each piezoelectric unit is respectively configured below each cutting area.

Based on the design of the present invention, the rectangular or round piezoelectric unit matches a first soft circuit board and a second soft circuit board with corresponding cuttings, each of the piezoelectric units in the piezoelectric vibration modules will have independent vibration, the interference between each of the piezoelectric units can be diminished, and the operational independence of each piezoelectric unit in the piezoelectric vibration module and haptic feedback module can be maintained, thus overcoming the problem existing in the prior art.

DETAILED DESCRIPTION OF THE INVENTION

For better understanding of the technical contents of the present invention, a preferred embodiment is used as an example to facilitate descriptions. Now please refer collectively to FIG. 1, FIG. 2A, FIG. 2B, FIG. 3, FIG. 4, FIG. 5A to FIG. 5C, FIG. 6A and FIG. 6B, which present an exploded view of a first embodiment of the piezoelectric vibration module of the present invention, top views of a first embodiment and a second embodiment, a schematic view of one of the vibration units in the first embodiment, a schematic view of the forced deformation of the vibration unit, model analysis drawings of a first embodiment of the piezoelectric vibration module of the present invention with 4, 6 and 8 vibration units, showing the values of ANSYS analytical calculations, a schematic view of the sensing circuit adopted in the piezoelectric vibration module of the present invention when used as the sensor of a haptic feedback module, and a schematic view of the driving circuit adopted in the piezoelectric vibration module of the present invention when used as the actuator of a haptic feedback module.

Figure 1:
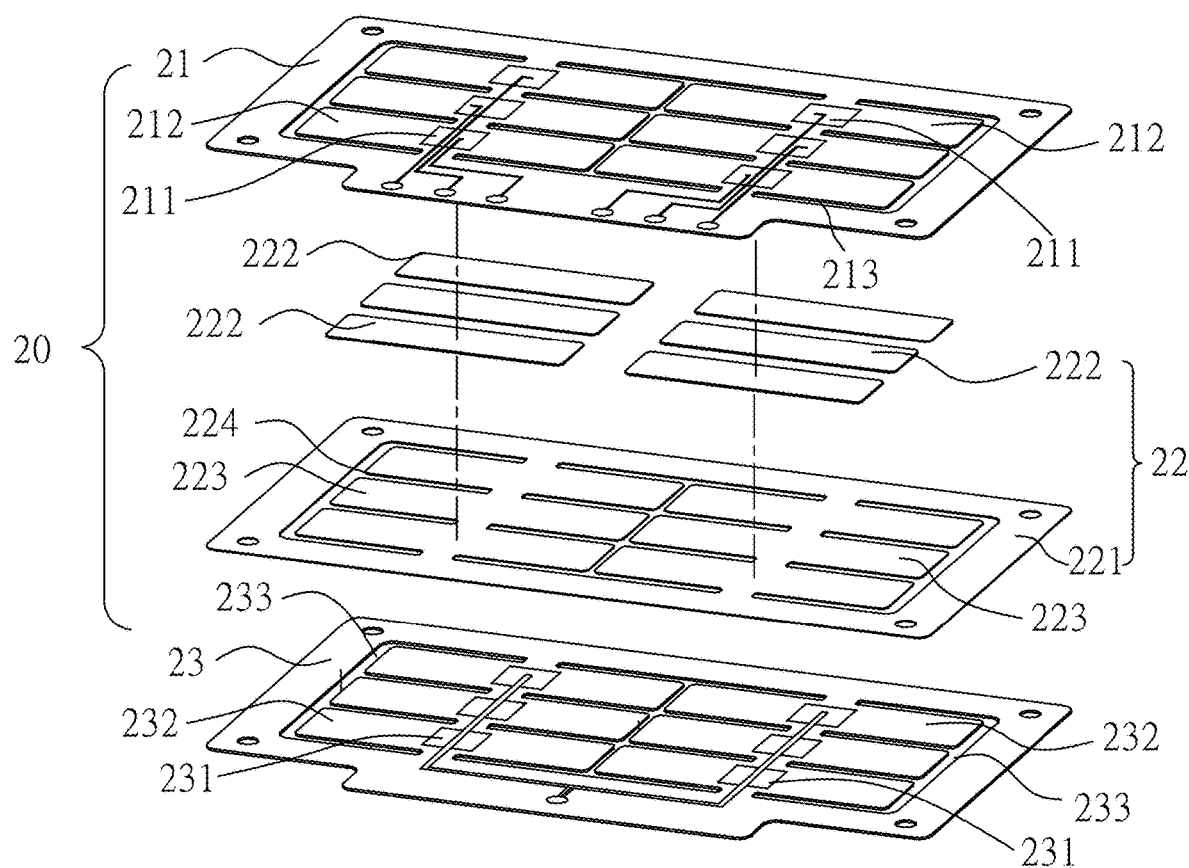
FIG. 1 is an exploded view of a first embodiment of the piezoelectric vibration module of the present invention.
Figure 2A:
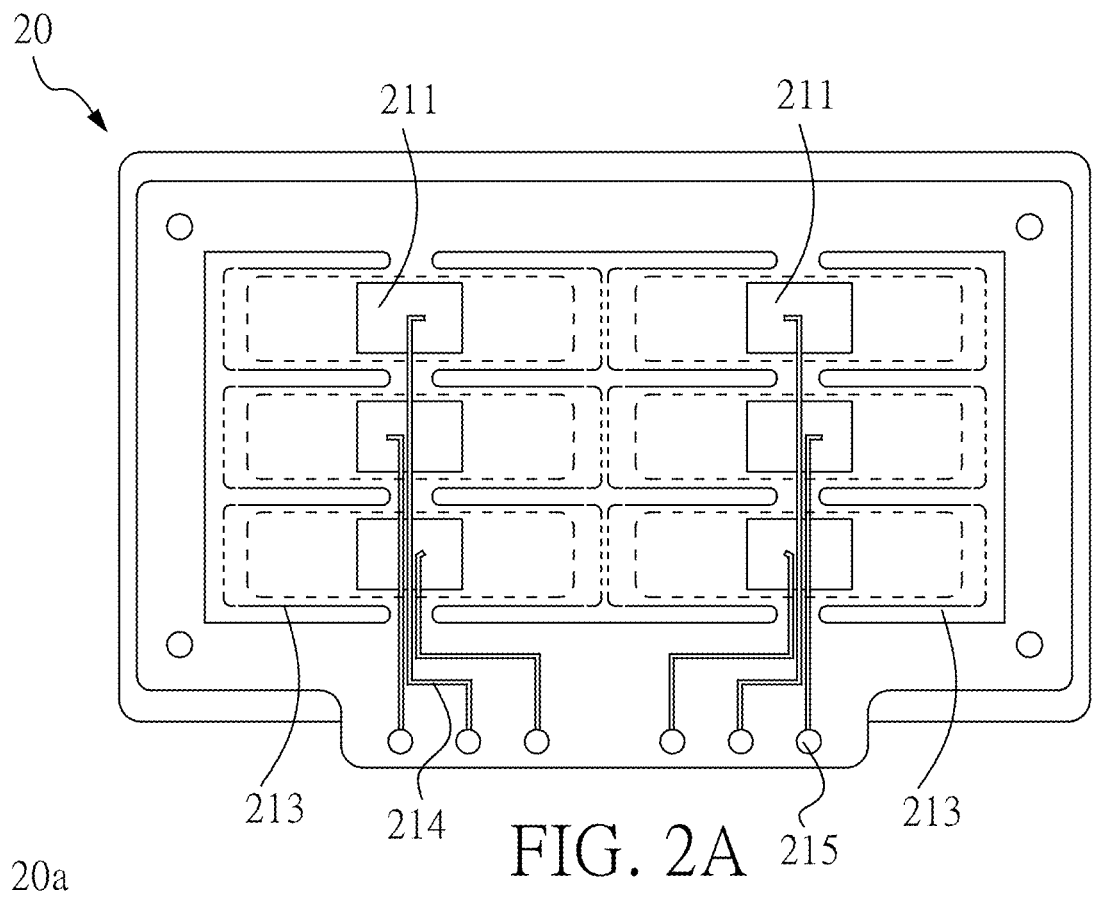
FIG. 2A is a top view of the first embodiment of the piezoelectric vibration module of the present invention.
Figure 5A:
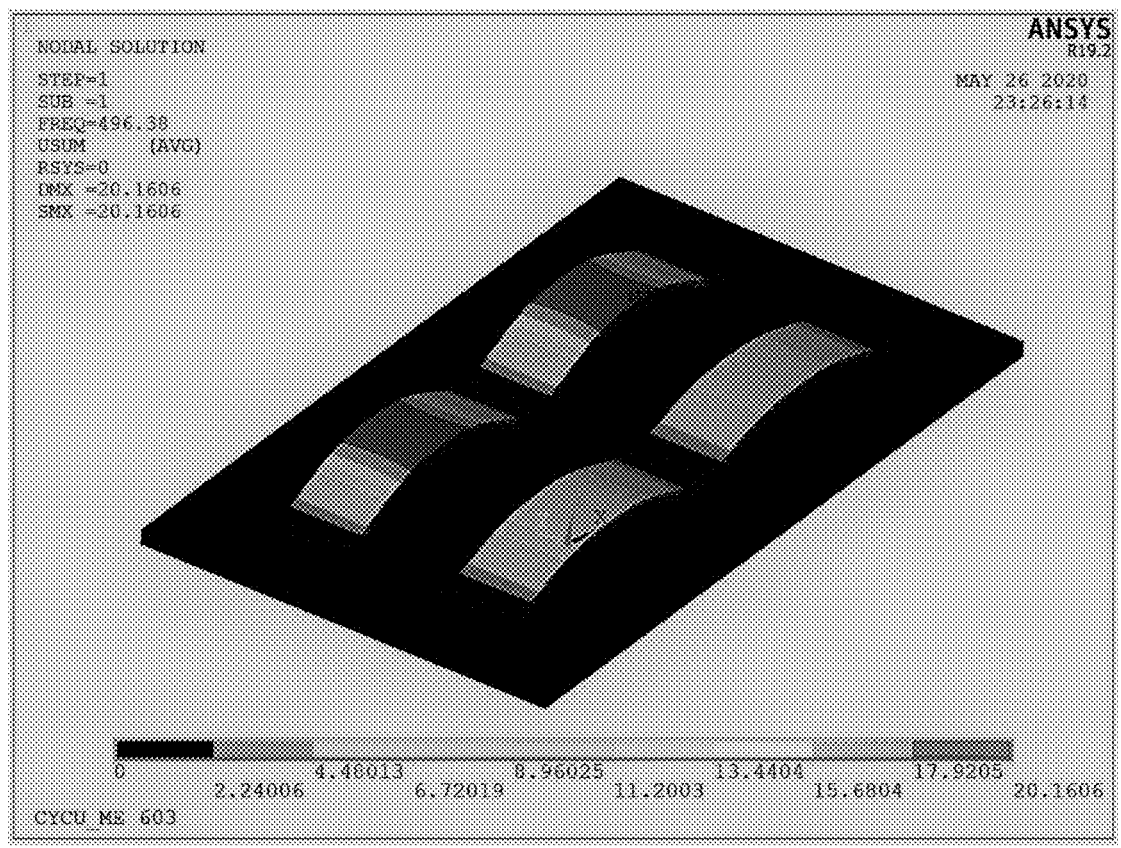
FIG. 5A is a model analysis drawing of the first embodiment of the piezoelectric vibration module of the present invention with 4 vibration units (force feedback units), showing the values of ANSYS analytical calculations.
Figure 5B:
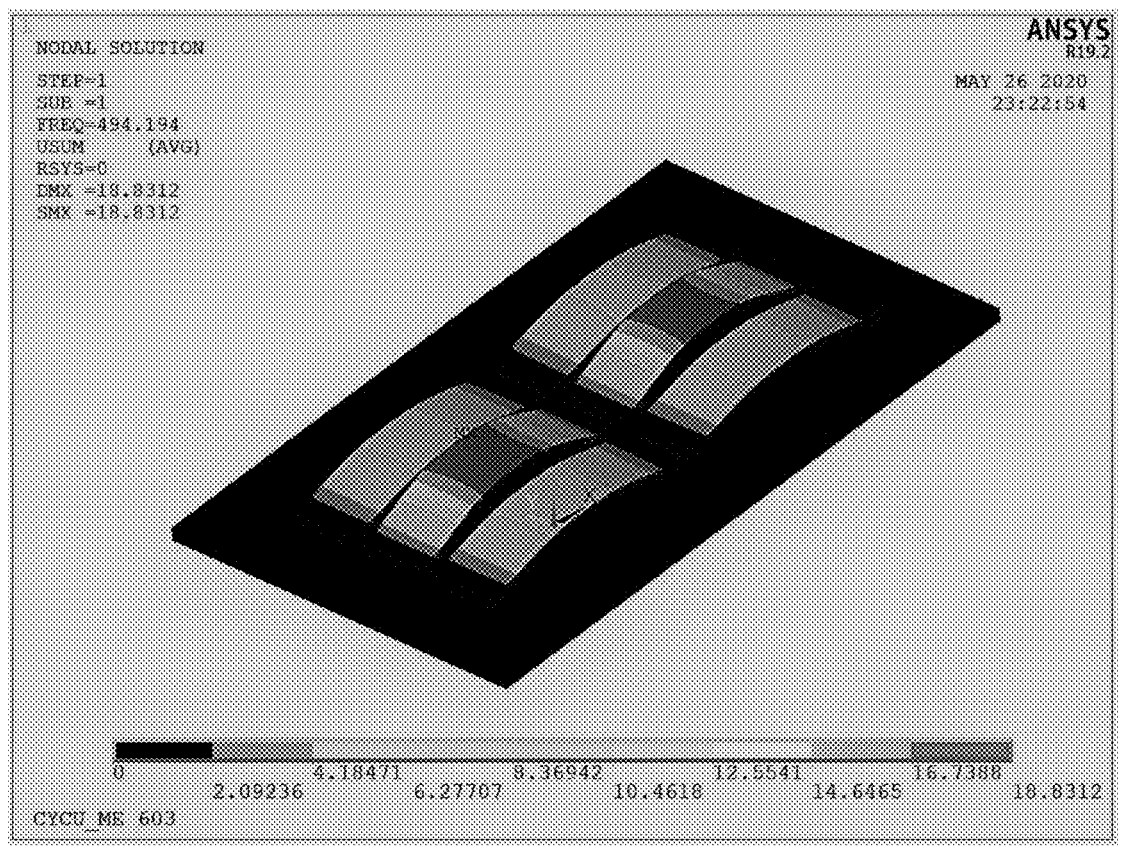
FIG. 5B is a model analysis drawing of the first embodiment of the piezoelectric vibration module of the present invention with 6 vibration units (force feedback units), showing the values of ANSYS analytical calculations.
Figure 5C:
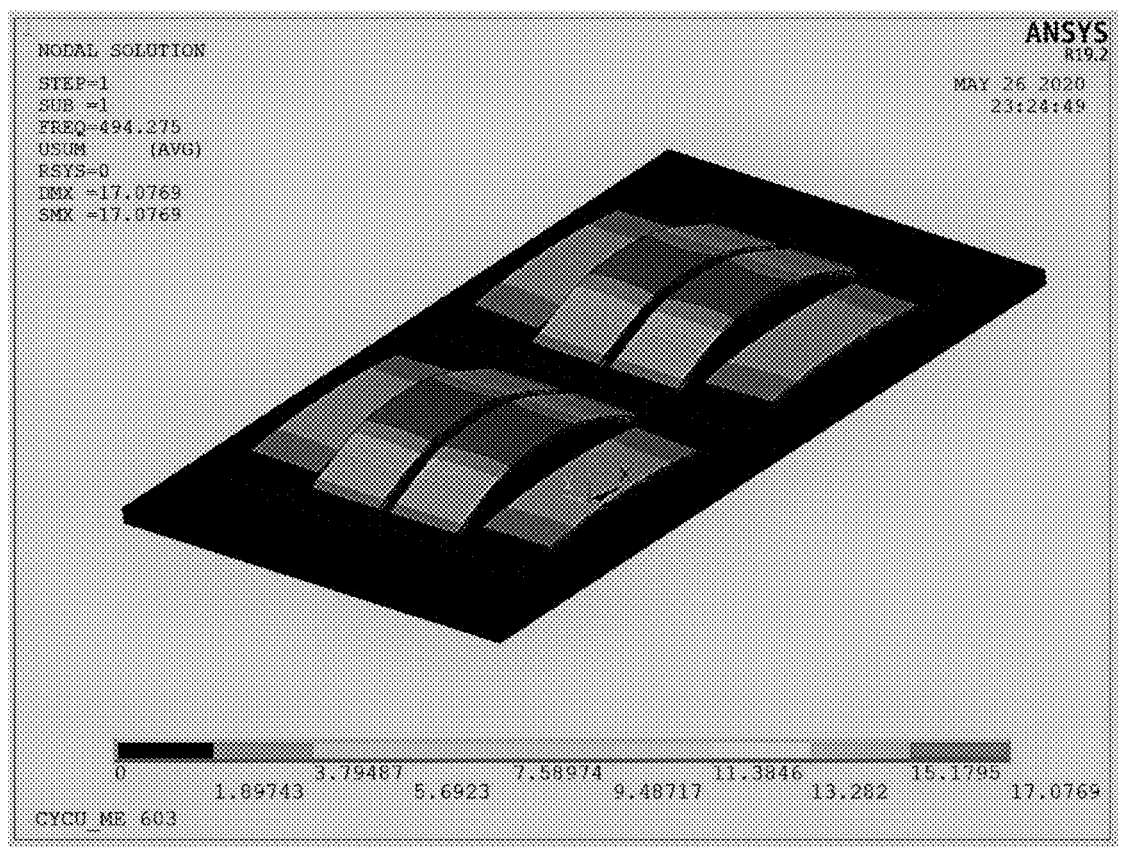
FIG. 5C is a model analysis drawing of the first embodiment of the piezoelectric vibration module of the present invention with 8 vibration units (force feedback units), showing the values of ANSYS analytical calculations.

As shown in FIG. 1 and FIG. 2A, the piezoelectric vibration module of the present invention 20 comprises a first soft circuit board 21, a plurality of piezoelectric units 22 and a second soft circuit board 23, wherein the first soft circuit board 21 and the second soft circuit board 23 comprise a plurality of cutting areas 212, 232, and two adjacent cutting areas 212, 232 are spaced with a cut through groove 213, 233, wherein each first electrode area 211 and each second electrode area 231 is respectively configured in each cutting area 212, 232, and each cutting area 212, 232 is in contact with each piezoelectric unit 22. Thus, as shown in FIG. 5A to FIG. 5C, each piezoelectric unit 22 in the piezoelectric vibration module 20 can vibrate independently without interfering with each other, maintaining the operational independence of each piezoelectric unit 22 and overcoming the problem existing in the prior art.

Figure 2B:
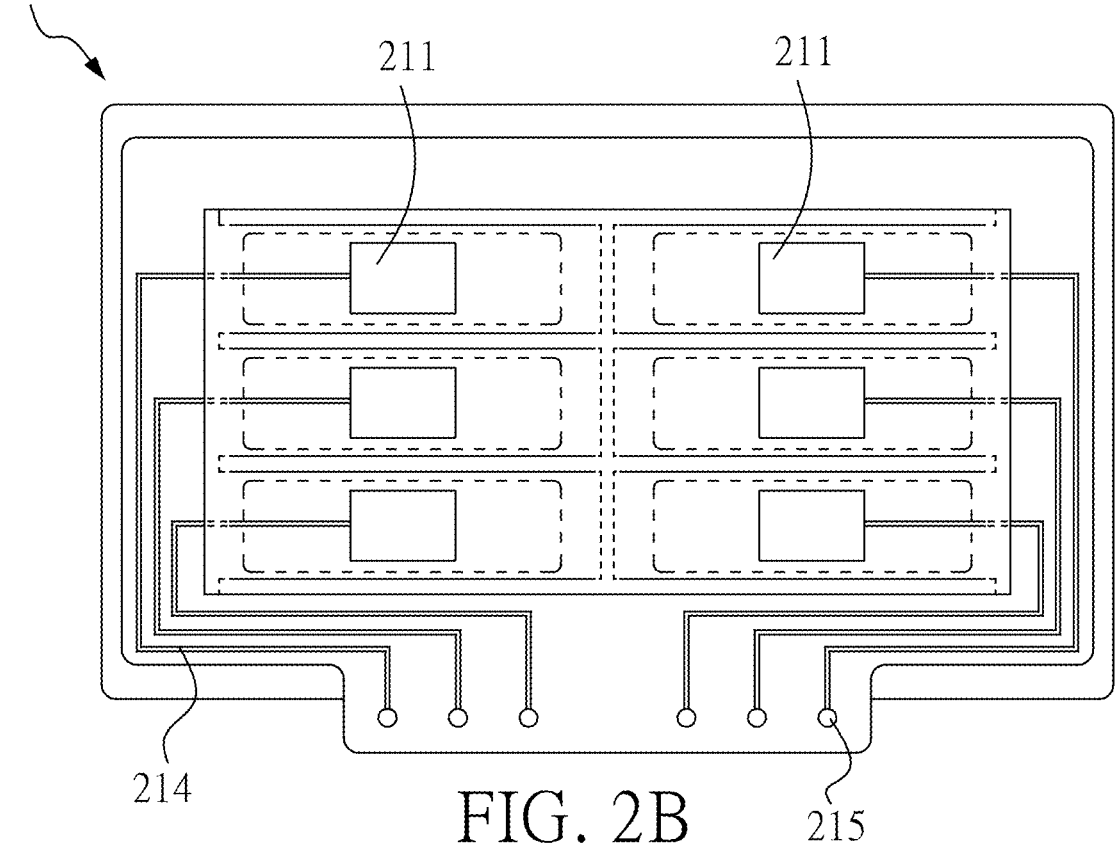
FIG. 2B is a top view of a second embodiment of the piezoelectric vibration module of the present invention.
Figure 6A:
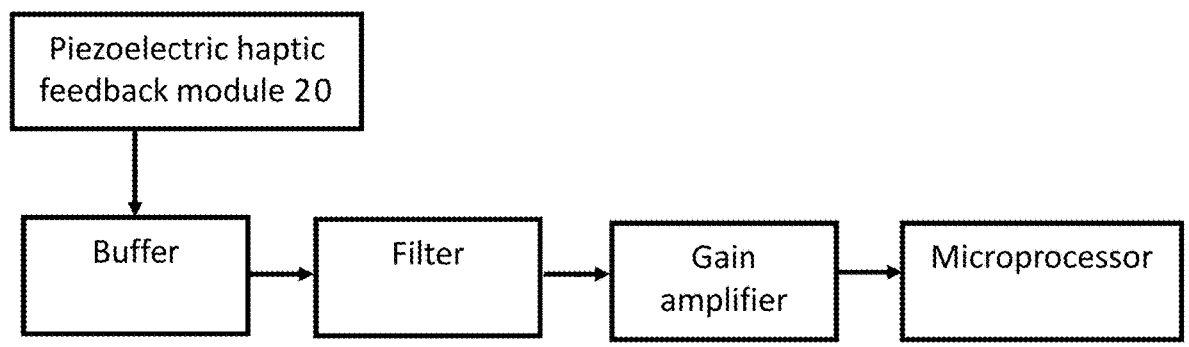
FIG. 6A is a schematic view of the sensing circuit adopted in the piezoelectric vibration module of the present invention when used as the sensor of a haptic feedback module.
Figure 6B:
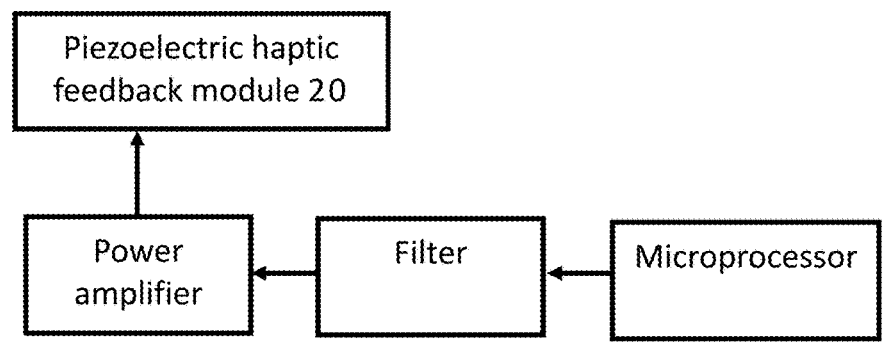
FIG. 6B is a schematic view of the driving circuit adopted in the piezoelectric vibration module of the present invention when used as the actuator of a haptic feedback module.

Please refer to FIG. 1 and FIG. 2A. To meet various design needs, the piezoelectric unit 22 in the piezoelectric vibration module of the present invention 20 can be designed in the form of arrays. In other words, each piezoelectric unit 22 can be designed as needed in the form of an M×N array, wherein M and N are both natural numbers. For example, the array shown in FIG. 2A and FIG. 2B is a 2×3 array, wherein M=2 and N=3. In addition, as shown in FIG. 6A and FIG. 6B, the piezoelectric vibration module of the present invention 20 can be used as a sensor or an actuator. When any one of the plurality of piezoelectric units 22 generates a positive piezoelectric effect, the piezoelectric vibration module 20 is used as a sensor and the sensing circuit of the piezoelectric vibration module 20 can be configured as shown in FIG. 6A. When any one of the plurality of piezoelectric units 22 generates a negative piezoelectric effect, the piezoelectric vibration module 20 is used as an actuator and the driving circuit matching the piezoelectric vibration module 20 can be configured as shown in FIG. 6B. However, the forms of the sensing circuit and driving circuit applicable to the present invention are not limited to the above embodiments.

It is to be noted here that the cut through grooves 213, 233 of the present invention are configured as completely hollowed-out areas in the first soft circuit board 21 and the second soft circuit board 23 and that the cut through grooves 213, 233 are cut around a plurality of edges of two adjacent cutting areas 212, 232. In the present embodiment, as shown in FIG. 1, the cutting areas 212, 232 are all rectangular, and the cut through grooves 213, 233 are U-shaped. In addition, any one of the cutting areas 212, 232 is surrounded by two cut through grooves 213, 233, and the openings of the U shapes of the two cut through grooves 213, 233 face each other. Alternatively, according to an embodiment of the present invention, as shown in FIG. 1, the cutting area 212, 232 has a perimeter, and the perimeter of the cut through groove 213, 233 is 80-90% that of the cutting area 212, 232. Either of the above two methods can realize the effect of independent vibration of each piezoelectric unit 22 in the piezoelectric vibration module 20 without interfering with each other.

Referring to FIG. 1 and FIG. 2A, the piezoelectric units 22 and the first electrode areas 211 in the first embodiment of the piezoelectric vibration module of the present invention 20 are all rectangular, and the cut through grooves 213, 233 are all rectangular. The wires 214 extend directly from the center of each first electrode area 211 to the electrical connection ends 215, parallel to the side of the minor axes of the piezoelectric vibration modules 20. As shown in FIG. 2B, the piezoelectric units 22 and first electrode areas 211 in the piezoelectric vibration module 20a of the second embodiment are all rectangular. The wires 214a extend first in the direction parallel to the major axes of the first electrode areas 211, then in the direction parallel to the minor axes of the piezoelectric vibration modules 20a, and finally to the electrical connection ends 215.

Figure 3:
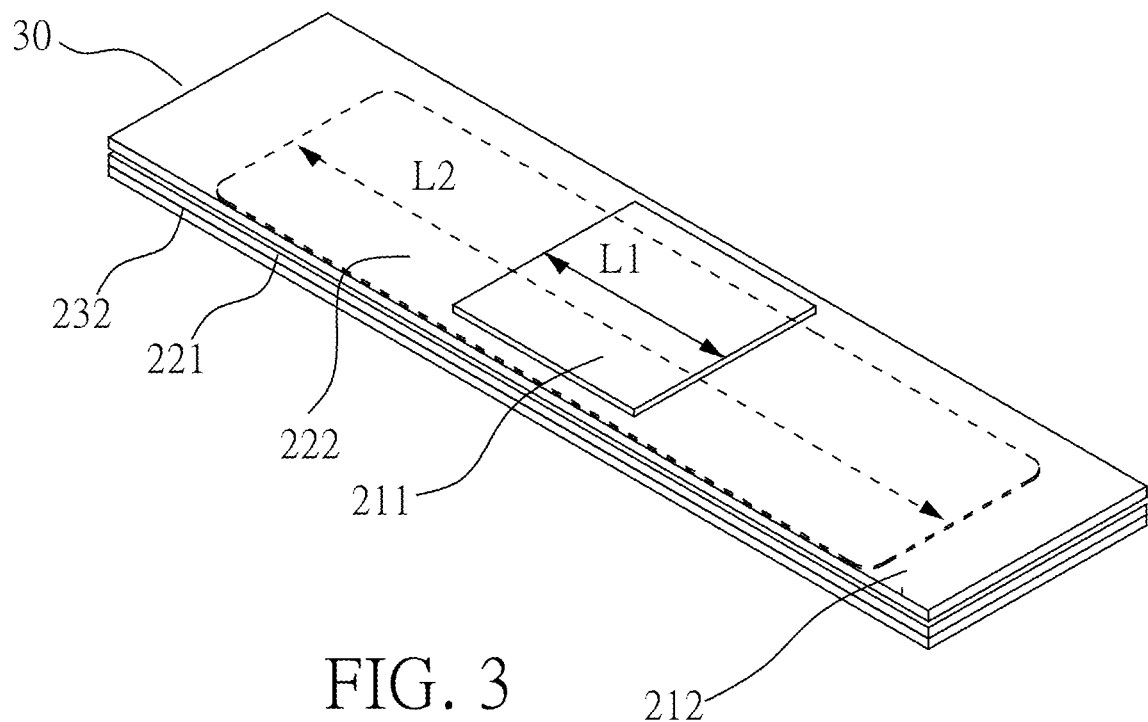
FIG. 3 is a schematic view of a vibration unit in the first embodiment of the piezoelectric vibration module of the present invention.
Figure 4:
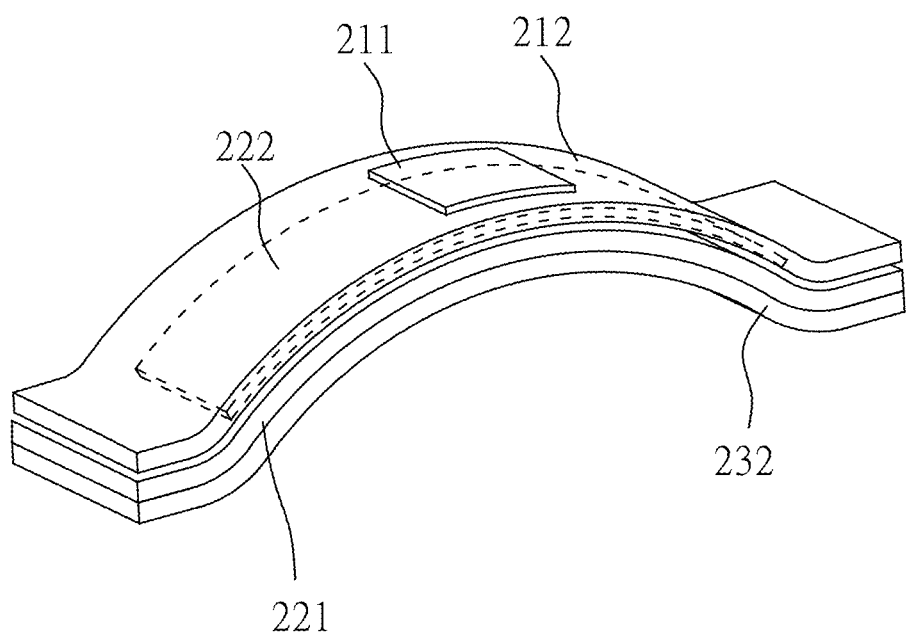
FIG. 4 is a schematic view of the forced deformation of one of the vibration units of the first embodiment of the piezoelectric vibration module of the present invention.

As shown in FIG. 1 and FIG. 3, the first soft circuit board 21 comprises a plurality of first electrode areas 211, wherein each first electrode area 211 has a first length L1, each piezoelectric unit 22 is respectively configured below each first electrode area 211, each piezoelectric unit 22 comprises a piezoelectric component 222, and the piezoelectric component 222 has a second length L2, wherein the first length L1 is 10-20% of the second length L2. Each piezoelectric unit 22 is located between the first soft circuit board 21 and the second soft circuit board 23. The second soft circuit board 23 comprises a plurality of second electrode areas 231, wherein each of the second electrode areas 231 also has a first length L1, the first length L1 of each second electrode area 231 being 10-20% of the second length L2. Thus, when any one of the plurality of piezoelectric units 22 generates a negative piezoelectric effect, the piezoelectric vibration module 20 will generate an effect of force feedback. Referring to FIG. 5A, FIG. 5B and FIG. 5C, when the piezoelectric vibration module 20 is used as an actuator, the resonance frequency of the piezoelectric vibration module 20 is lower than 500 Hz, which is within the frequency range best perceptible to the human body. On the other hand, when the piezoelectric vibration module 20 is used as a sensor, the degree of the resonance frequency has no influence on the operational performance of the piezoelectric vibration module 20.

Referring to FIG. 1, in the present embodiment, the first electrode areas 211 of the first soft circuit board 21 are connected to the electrical connection ends 215 through wire pores and wires 214 independently in parallel, whereas the second electrode areas 231 of the second soft circuit board 23 are connected to the electrical connection ends 215 through shared wires. Thus, when any one of the plurality of piezoelectric units 22 generates a piezoelectric effect, then due to the feature that each of the first electrode areas 211 and each of the second electrode areas 231 is located in the center of the piezoelectric unit 22, the actuated piezoelectric unit 22 can generate an arcuate deformation with a vibration frequency lower than 500 Hz. According to research, the haptic perception frequency of the human body is lower than 500 Hz, and the optimal perception frequency is from 300 Hz to 100 Hz. The resonance frequency generated by the piezoelectric vibration module of the present invention 20 when used as an actuator falls within this range. It is to be noted here that it will be sufficient as long as each of the first electrode areas 211 and each of the second electrode areas 231 is respectively located in the center of the length of each piezoelectric unit 22. Using the rectangular shape as an example, the center of the length referred to and applicable in the present invention means that the distance from the two relative minor axes of each first electrode area 211 and the distance from each second electrode area 231 to the two relative minor axes of the piezoelectric unit 22 are equal or within an error range below 10%.

Further, as shown in FIG. 1, the piezoelectric unit 22 comprises an elastic component 221, wherein the piezoelectric component 222 is located between the elastic component 221 and the second soft circuit board 23. Based on a preferred embodiment of the present invention, the piezoelectric component 222 is PZT or PVDF film or made of piezoelectric materials with the same nature. The present invention is not limited to the above materials. In addition, as shown in FIG. 1, to match the cutting areas 212, 232 in the first soft circuit board 21 and the second soft circuit board 23, there are also corresponding cutting areas 223 in the elastic component 221, and between any two adjacent cutting areas 223, there is a cut through groove 224.

Because the first electrode areas 211 and the second electrode areas 231 are both critical components of the first soft circuit board 21 and the second soft circuit board 23, and as shown in FIG. 5A, FIG. 5B and FIG. 5C, based on the feature that the center lines of the first electrode areas 211 of the present invention coincide with the center lines of the piezoelectric unit 22, the haptic feedback module 1 of the present invention can maintain a resonance frequency of the piezoelectric vibration module below 500 Hz without any additional mass. This solves the problem existing in the prior art. In addition, all of the components of the piezoelectric vibration module 20 are thin and can be easily bonded on thin touch panels. This meets the trend of designing thin and light electronic devices and touch panels.

Figure 7A:
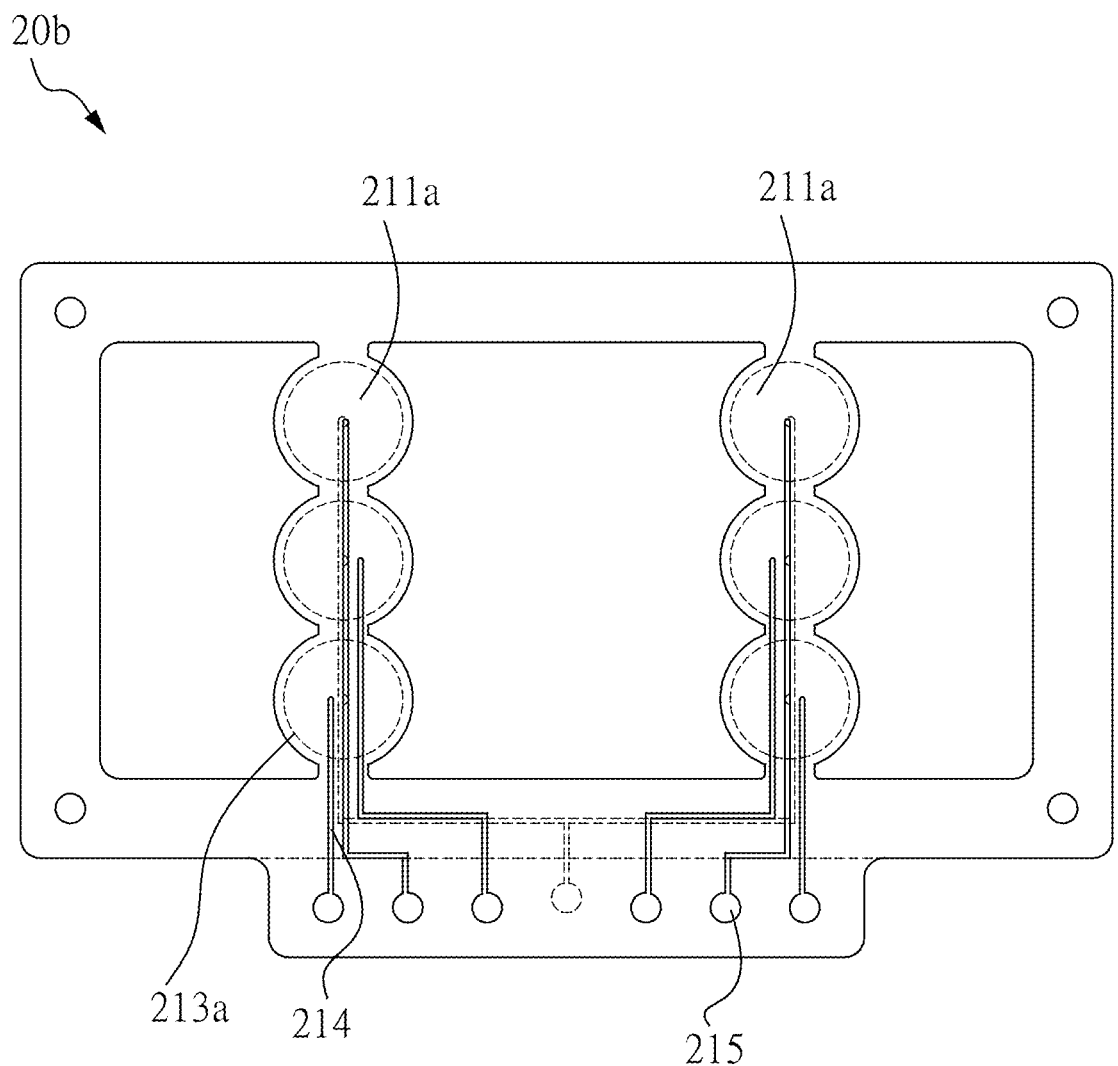
FIG. 7A is an exploded view of a third embodiment of the piezoelectric vibration module of the present invention.
Figure 7B:
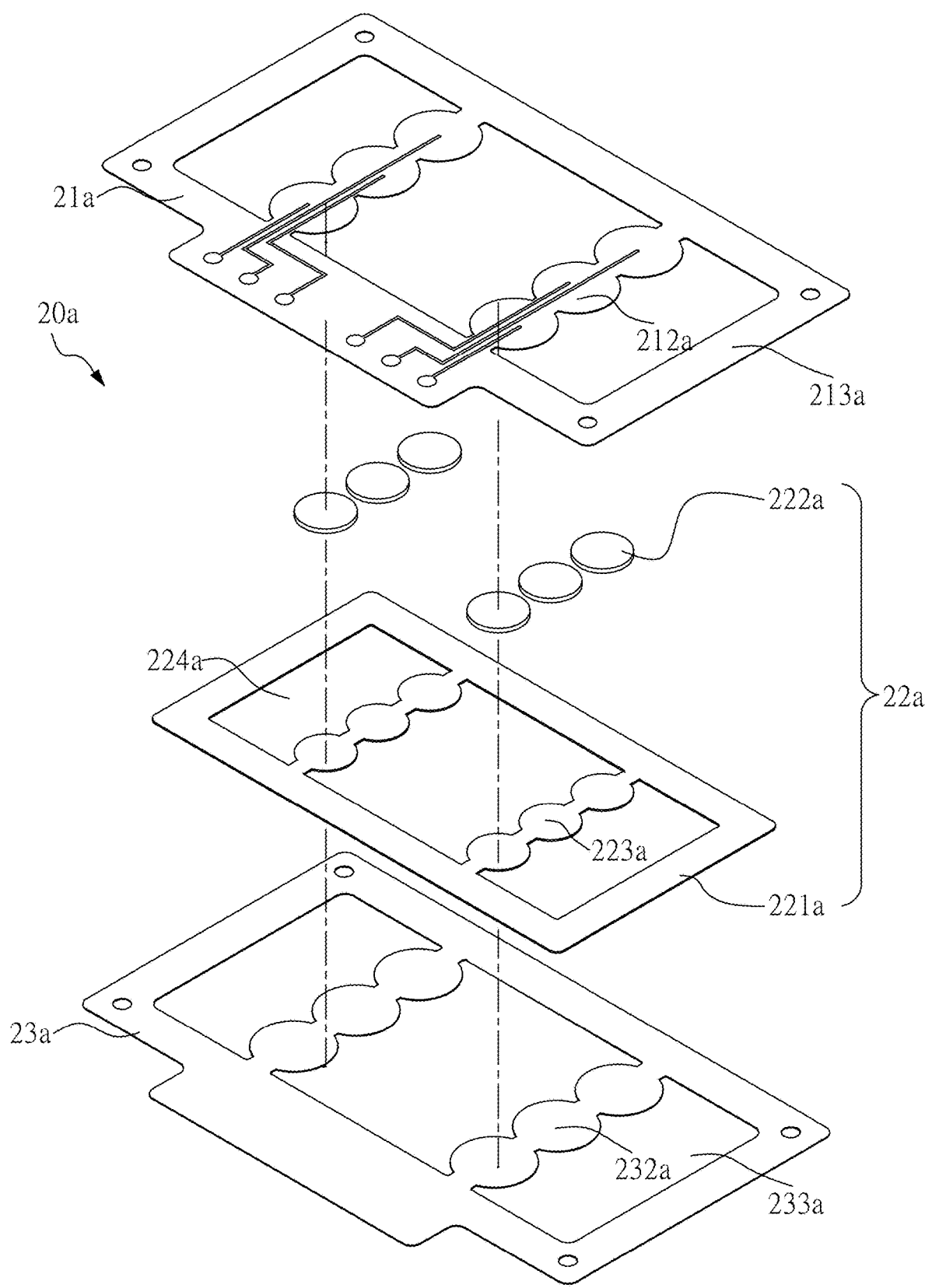
FIG. 7B is a top view of a third embodiment of the piezoelectric vibration module of the present invention.

Please refer to FIG. 7A and FIG. 7B, which respectively present a top view and an exploded view of a third embodiment of the piezoelectric vibration module of the present invention.

As shown in FIG. 7A and FIG. 7B, in the third embodiment, each of the first electrode areas 211a, the piezoelectric units 22a and the second electrode area 231a in the piezoelectric vibration module of the present invention 20b are all round, and between two adjacent first electrode areas 211a, there is a cut through groove 213a; between two adjacent piezoelectric units 22a, there is a cut through groove 224a; and between two adjacent second electrode areas 231a, there is a cut through groove 233a, wherein the cut through grooves 213a, 224a, 233a are arcuate. Thus, each piezoelectric unit 22 in the piezoelectric vibration module 20 can vibrate independently without interfering with each other, maintaining the operational independence of each piezoelectric unit 22. Referring to FIG. 7A and FIG. 7B, each first electrode area 211a, each piezoelectric unit 22a and each second electrode area 231a in the haptic feedback module 1 of the present invention are all round, and the cut through grooves 213a, 233a are arcuate and are completely hollowed out. The arcuate openings are for configuration of the wire 214a. Thus, each first electrode area 211a, each piezoelectric unit 22a and each second electrode area 231a can be electrically connected to the corresponding electrical connection ends 215.

Figure 8:
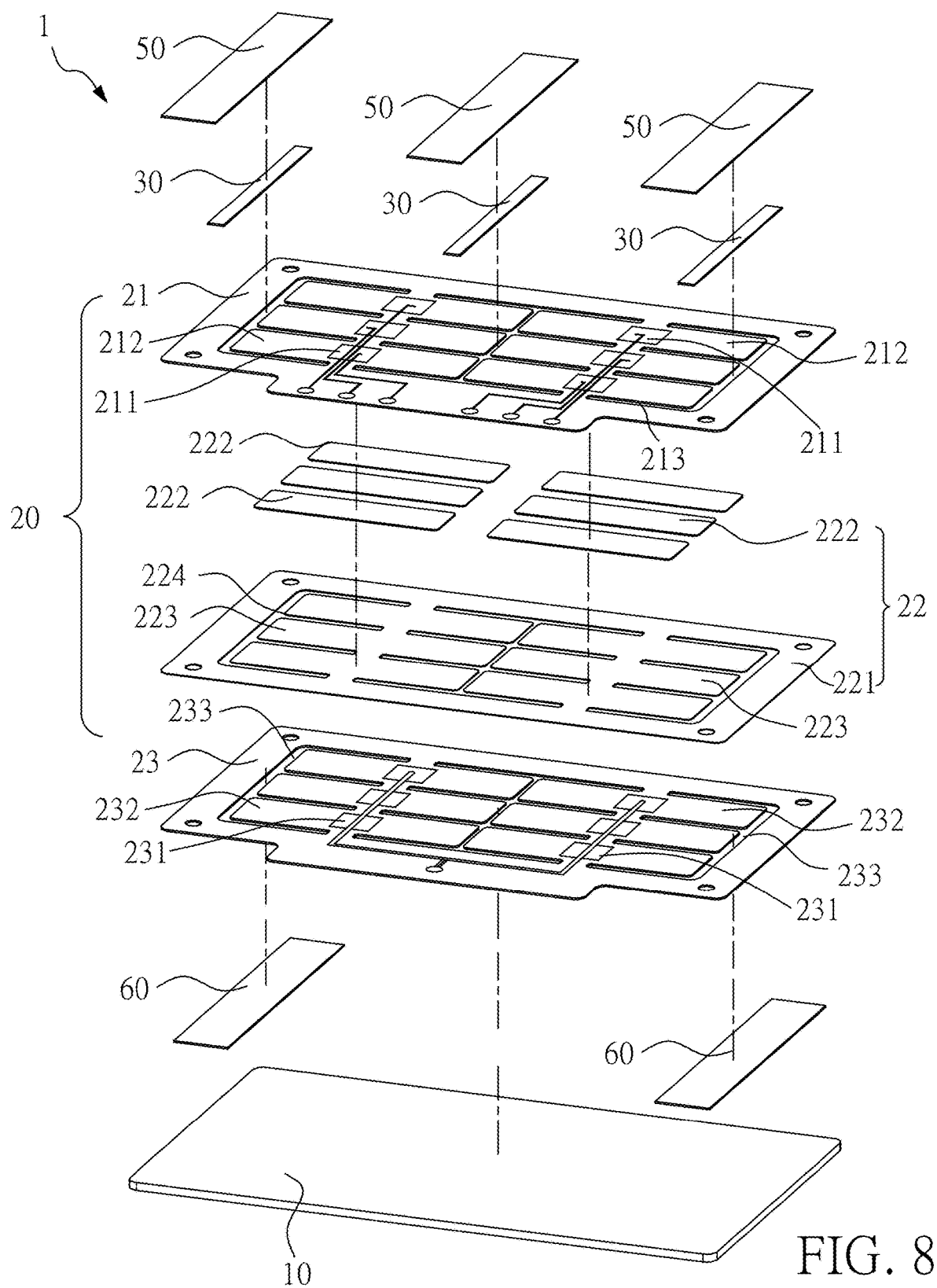
FIG. 8 is an exploded view of a first embodiment of the haptic feedback module of the present invention.

Please refer collectively to FIG. 8, FIG. 9A, FIG. 9B, FIG. 10, FIG. 11 and FIG. 12, which present an exploded view of a first embodiment of the haptic feedback module of the present invention, a top view of a first embodiment, a top view of a second embodiment, a schematic view of one of the force feedback units of a first embodiment of the haptic feedback module, a schematic view of the forced deformation of one of the force feedback units in the first embodiment of the haptic feedback module, and a model analysis drawing of the first embodiment of the haptic feedback module of the present invention based on the embodiment shown in FIG. 8, showing the values of ANSYS analytical calculations.

Figure 9A:
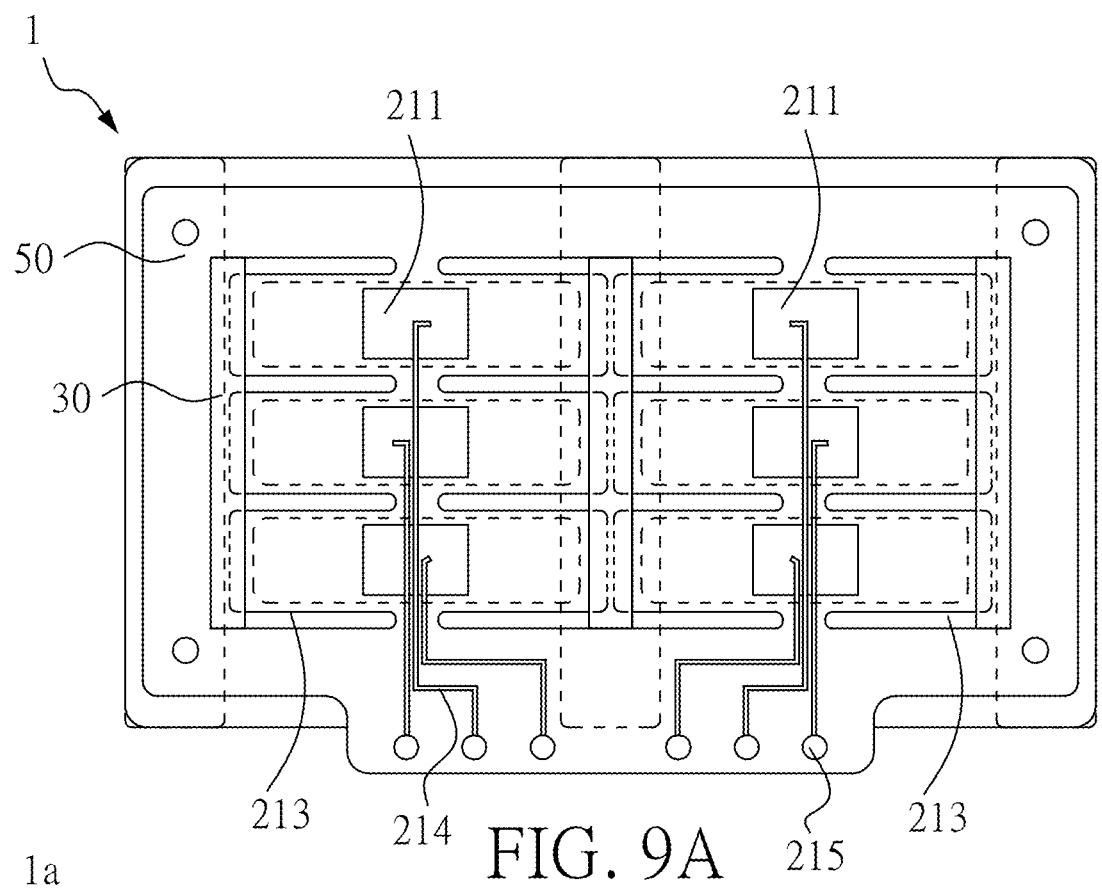
FIG. 9A is a top view of the first embodiment of the haptic feedback module of the present invention.
Figure 9B:
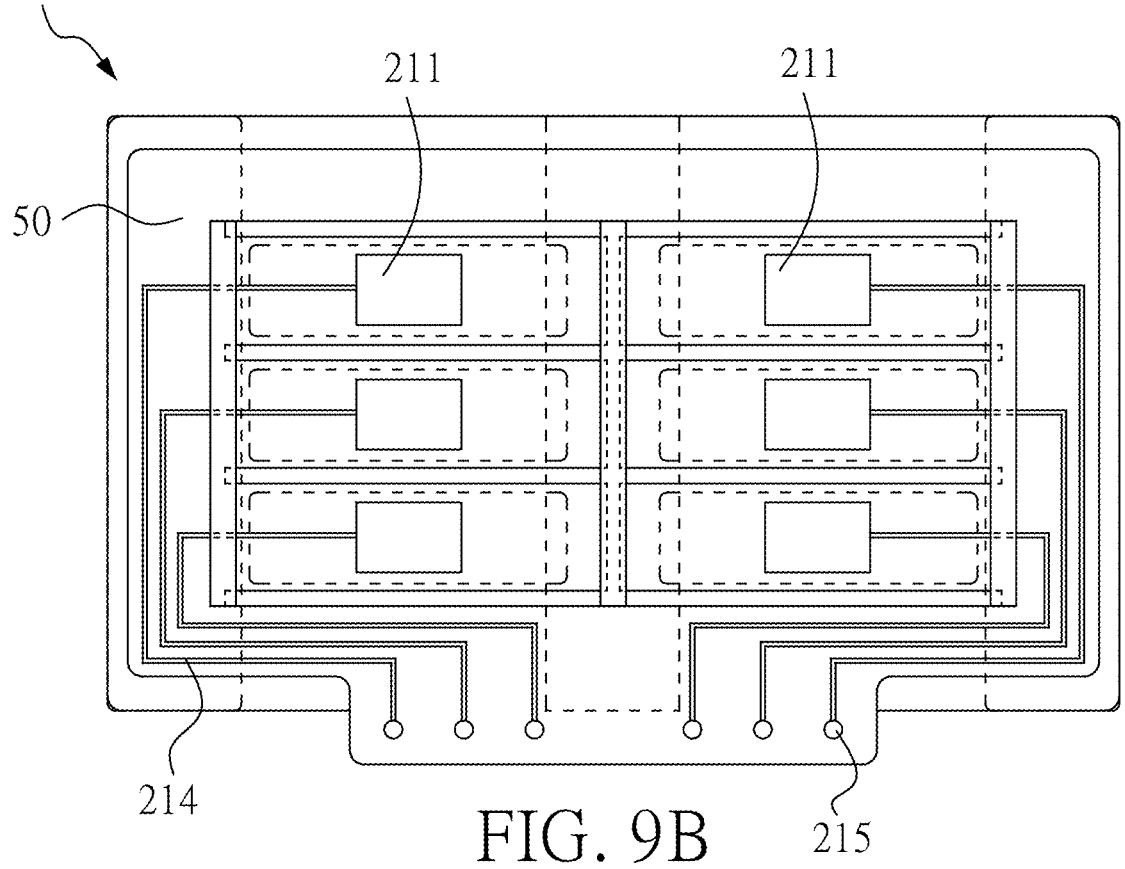
FIG. 9B is a top view of a second embodiment of the haptic feedback module of the present invention.
Figure 10:
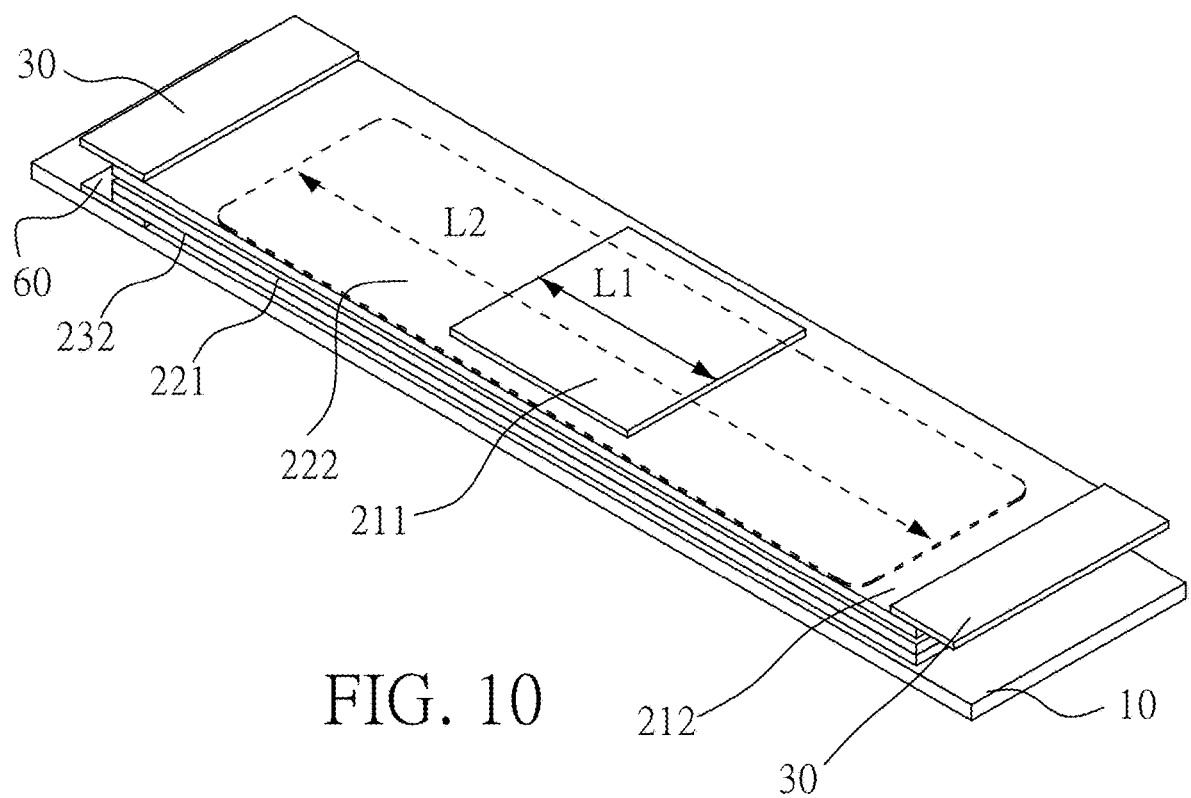
FIG. 10 is a schematic view of one of the force feedback units in the first embodiment of the haptic feedback module of the present invention.
Figure 11:
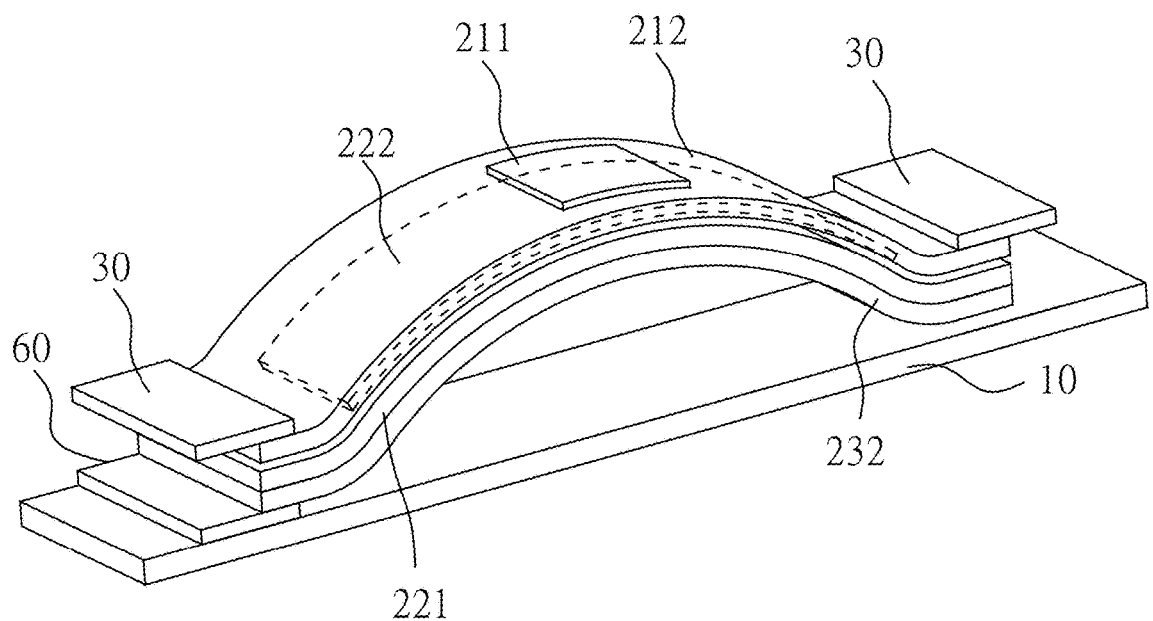
FIG. 11 is a schematic view of forced deformation of one of the force feedback units in the first embodiment of the haptic feedback module of the present invention.
Figure 12:
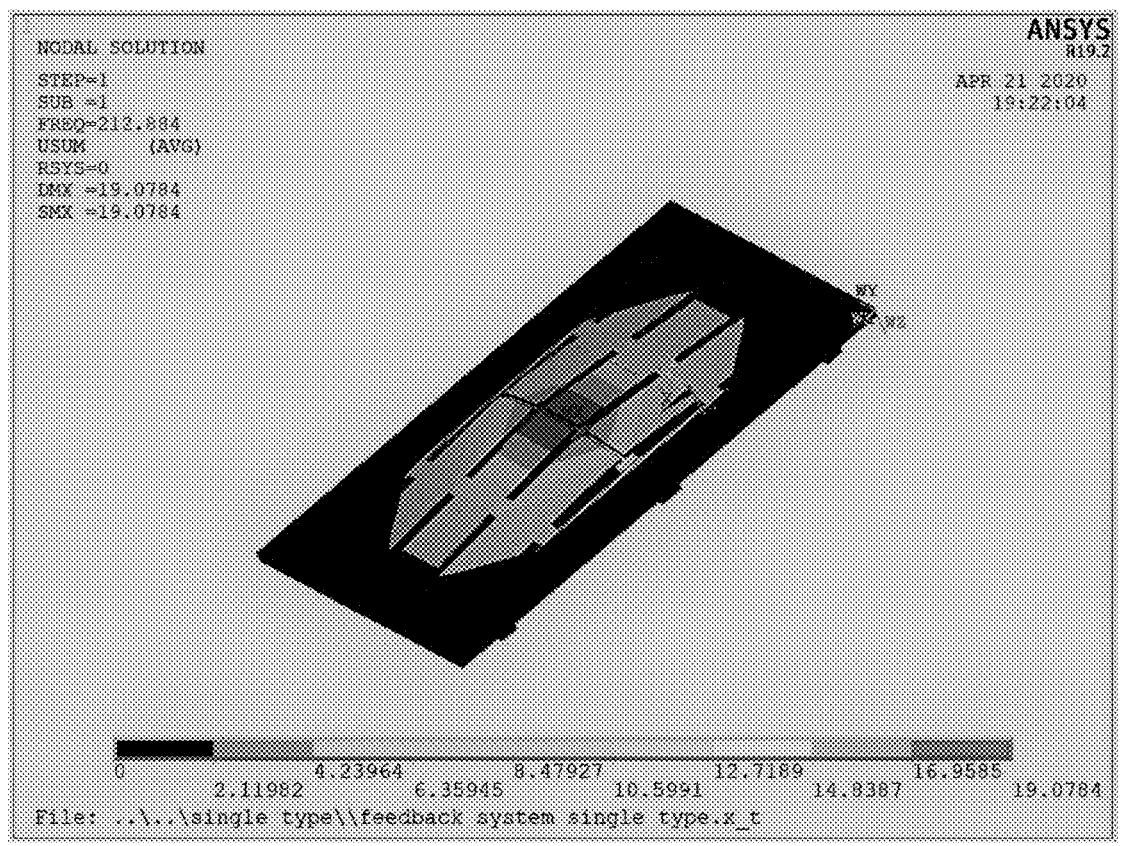
FIG. 12 is a model analysis drawing of the first embodiment of the haptic feedback module of the present invention based on the embodiment shown in FIG. 8, showing the values of ANSYS analytical calculations.

Referring to FIG. 8 and FIG. 9A, the haptic feedback module 1 of the present invention comprises a touch panel 10 and the aforementioned piezoelectric vibration module 20, wherein the piezoelectric vibration module 20 is located below the touch panel 10. When the user's finger touches the touch panel 10, one of the plurality of piezoelectric units 22 generates a piezoelectric effect, and the piezoelectric vibration module 20 will generate a resonant effect of force feedback. As shown in FIG. 5A, FIG. 5B and FIG. 5C, the resonance frequency is lower than 500 Hz. In addition, based on different distributions of the wires 214, when the piezoelectric unit 22 and first electrode area 211 in the first embodiment are all rectangular, the present invention can be configured in the style shown in FIG. 9A, i.e., the haptic feedback module 1, or it can be configured in the style shown in FIG. 9B, i.e., the haptic feedback module 1a. Based on a preferred embodiment of the present invention, as shown in FIG. 8 and FIG. 9A, the haptic feedback module 1 of the present invention further comprises a plurality of first pressing bars 30, wherein each first pressing bar 30 is respectively configured on the two opposite sides of each cutting area 213 of the first soft circuit board 21 and the two opposite sides of each cutting area 232 of the second soft circuit board 23. In the present embodiment, each cutting area 213 of the first soft circuit board 21 and each cutting area 232 of the second soft circuit board 23 is rectangular, and each first pressing bar 30 is respectively configured on the sides of the two minor axes of each cutting area 213 of the first soft circuit board 21. Based on this, as shown in FIG. 12, when any one of the plurality of piezoelectric units 22 generates a piezoelectric effect, the piezoelectric vibration module 20 can generate a resonance frequency lower than 300 Hz. When a plurality of first pressing bars 30 are used to apply a clamping force on the upper and lower ends of the piezoelectric vibration module 20 to join it with the touch panel 10, a vibration frequency lower than 500 Hz can be obtained (as shown in FIG. 12). According to research, the haptic perception frequency of the human body is lower than 500 Hz, and the optimal perception frequency is from 300 Hz to 100 Hz. The resonance frequency generated by the piezoelectric vibration module of the present invention 20 when used as an actuator falls within this range. This will strengthen the haptic feeling of the user. Based on one embodiment of the present invention, as shown in FIG. 8 and FIG. 9A, the haptic feedback module 1 of the present invention further comprises a plurality of first assisting bars 50, which individually cover each of the first pressing bars 30 to strengthen the clamping of each first pressing bar 30 on the piezoelectric vibration module 20. As shown in FIG. 1, in the present embodiment, the haptic feedback module 1 further comprises two lamination bars 60, wherein each lamination bar 60 is respectively used to laminate the piezoelectric vibration module 20 with the touch panel 10.

It is to be noted here that, as shown in FIG. 8 and FIG. 9A, to meet the design need for various touch panels, the piezoelectric units 22 in the piezoelectric haptic feedback module 20 of the present invention can be designed in the form of an array, and each piezoelectric unit 22 can be designed in the form of an M×N array, wherein M and N are both natural numbers. For example, the array in FIG. 8 is a 2×3 array, wherein M=2 and N=3.

Based on the design of the present invention, the rectangular or round piezoelectric units 22 match a first soft circuit board 21, 21a and a second soft circuit board 23, 23a with corresponding cuttings, each of the piezoelectric units 22 in the piezoelectric vibration modules 20, 20a, 20b will have independent vibration, the interference between each of the piezoelectric units 22 can be diminished, and the operational independence of each piezoelectric unit 22 in the piezoelectric vibration module 20, 20a, 20b and haptic feedback module 1, 1a, 1b can be maintained, thus overcoming the problem existing in the prior art.

It is to be noted, however, that the embodiments mentioned above are examples for descriptive purposes only and are not intended to limit the scope of the present invention as claimed below.

The invention claimed is:

1. A piezoelectric vibration module comprising:
a first soft circuit board, comprising a plurality of cutting areas, a plurality of first electrode areas and a plurality of cut through grooves, wherein each one of the cutting areas is surrounded by two of the cut through grooves and each of the first electrode areas is configured in each of the cutting areas, the two cut through grooves surrounding the same cutting area do not communicate to each other and located at opposite ends of the cutting area;
a plurality of piezoelectric units, wherein each of the piezoelectric units is respectively configured below each of the cutting areas; and
a second soft circuit board, wherein each of the piezoelectric units is located between the first soft circuit board and the second soft circuit board, and the second soft circuit board comprises a plurality of cutting areas and a plurality of cut through grooves, wherein each one of the cutting areas is surrounded by two of the cut through grooves, the two cut through grooves surrounding the same cutting area do not communicate to each other and located at opposite ends of the cutting area.

2. The piezoelectric vibration module defined in claim 1, wherein the plurality of cutting areas are rectangular, the cut through grooves are U-shaped and located at two short ends of the cutting area, and openings of the U shapes of the two cut through grooves surrounding the same cutting area are facing to each other.

3. The piezoelectric vibration module defined in claim 1, wherein the plurality of cutting areas are round and the cut through grooves are arcuate, wherein openings of the arcuate shapes of the two cut through grooves surrounding the same cutting area are facing to each other.

4. The piezoelectric vibration module defined in claim 1, wherein each of the cutting areas has a perimeter, the perimeter of the cut through grooves being 80-90% of a perimeter of a cutting area.

5. The piezoelectric vibration module defined in claim 4, wherein the first soft circuit board comprises a plurality of first electrode areas, wherein each of the first electrode areas is configured in each of the cutting areas.

6. The piezoelectric vibration module defined in claim 1, wherein the plurality of cutting areas of the second soft circuit board are rectangular, the cut through grooves of the second soft circuit board are U-shaped and located at two short ends of the cutting area, and the openings of the U shapes of the two cut through grooves surrounding the same cutting area are facing to each other.

7. The piezoelectric vibration module defined in claim 1, wherein the plurality of cutting areas of the second soft circuit board are round, and the cut through grooves of the second soft circuit board are arcuate, wherein openings of the arcuate shapes of the two cut through grooves surrounding the same cutting area are facing to each other.

8. The piezoelectric vibration module defined in claim 1, wherein each of the cutting areas of the second soft circuit board has a perimeter, the perimeters of the cut through grooves of the second soft circuit board being 80-90% of the perimeter of a cutting area.

9. The piezoelectric vibration module defined in claim 1, wherein the second soft circuit board comprises a plurality of second electrode areas, and each of the piezoelectric units respectively touches each of the cutting areas in the second soft circuit board.

10. The piezoelectric vibration module defined in claim 9, wherein the piezoelectric unit comprises two elastic components and one piezoelectric component, wherein the piezoelectric component is located between the two elastic components, and the piezoelectric component contacts the first electrode area and the second electrode area respectively through the two elastic components.

11. A haptic feedback module, which comprises a touch panel and a piezoelectric vibration module as defined in claim 1, wherein the piezoelectric vibration module is configured below the touch panel, wherein when any one of the plurality of piezoelectric units generates a piezoelectric effect, a resonance frequency of the piezoelectric unit is lower than 500 Hz.

12. The haptic feedback module defined in claim 11, wherein each of the first electrode areas has a first length L1 and each of the piezoelectric units has a second length L2, wherein the first length L1 is 10-20% of the second length L2.

13. The haptic feedback module defined in claim 11, wherein each of the second electrode areas has a first length L1, wherein the first length L1 of each of the second electrode areas is 10-20% of the second length L2.

14. The haptic feedback module defined in claim 11, wherein the piezoelectric units each comprise an elastic component and a piezoelectric component, the piezoelectric component is located between the elastic component and the second soft circuit board, and the piezoelectric component has a third length L3, wherein the first length L1 is 10-20% of the third length L3.

15. The haptic feedback module defined in claim 11, further comprising a plurality of first pressing bars, wherein each of the first pressing bars is respectively configured on the two opposite sides of each cutting area of the first soft circuit board such that when any one of the plurality of piezoelectric units generates the piezoelectric effect, the resonance frequency of the piezoelectric unit is lower than 300 Hz.

16. The haptic feedback module defined in claim 15, further comprising a plurality of lamination bars, wherein each of the lamination bars is used to laminate the piezoelectric vibration module with the touch panel.

* * * * *